INVENTOR
Rolf R Haberecht

BY Kenneth R Glaser

ATTORNEY

United States Patent Office 3,458,368
Patented July 29, 1969

3,458,368

INTEGRATED CIRCUITS AND FABRICATION THEREOF

Rolf R. Haberecht, Richardson, Tex., assignor to Texas Instruments Incorporated, Dallas, Tex., a corporation of Delaware Filed May 23, 1966, Ser. No. 552,143
Int. Cl. H01l 7/36
U.S. Cl. 148—175 2 Claims

ABSTRACT OF THE DISCLOSURE

This specification discloses a method of forming an integrated circuit characterized by:

(1) Forming on a given substrate; respectively and without the usual complex, multihandling operations;

(a) a first block of semiconductor material,
(b) a second block of a reducible dielectric material,
(c) a third block of ferrite, and
(d) an insulating film covering the substrate intermediate the first, second, and third blocks;

(2) Forming a semiconductor device in the first block;
(3) Forming a resistor in the second block; and
(4) Forming a capacitor or an inductor in the third block. An electron beam below a maximum power level is employed to effect the desired depositions and components with the substrate maintained in one reaction chamber. Various vaporous, or gaseous, reactants are flowed past the substrate during the respective operations but external contamination is avoided. Specific materials, reactants, and operations are given.

This invention relates to a method for fabricating electronic components, and more particularly to a technique for fabricating an integrated circuit utilizing a concentrated energy source for its fabrication.

The substantial growth and interest in microminiaturization in the electronics field has been reflected in the rapid development of integrated circuitry whereby hundreds of active and/or passive components have been formed in or on a single substrate. Fabrication of these integrated circuits presently involve a series of process steps including epitaxial depositions and/or diffusion operations to form each of the components, and a series of metallization operations to interconnect the various components to provide the desired circuit network on the semiconductor slice. Present day techniques for accomplishing these steps, however, utilize a series of oxide formations coupled with a series of photographic masking and etching operations to selectively remove the oxide where it is not desired, the remaining oxide serving as a diffusion mask, passivating layer, or insulating coating for the metallizations as the case may be.

The difficulty with the present day approach is the lack of high resolution obtainable with the photographic techniques to obtain extremely small dimension components, as well as the high cost of processing associated with the plurality of oxide formations and selective removals and the continual transferring of the semiconductor slice from one location to another to perform the various process steps.

It is therefore an object of the present invention to fabricate an integrated circuit by a process which eliminates substantially all photographic masking and etching operations in its fabrication, which allows the formation of circuit components having smaller dimensions than heretofore obtainable, and which allows the complete fabrication of an integrated circuit in or on a semiconductor slice without transferring the semiconductor slice from one location to another.

In accordance with these and other objects, features and advantages thereof, the present invention involves the fabrication of an integrated circuit on or in a semiconductor substrate, including the steps of:

(1) Selectively forming various layers or blocks of thin and thick films of monocrystalline and/or polycrystalline material adjacent one another, these layers or blocks having various geometrical configurations, (2) Forming electronic components by selective diffusions into these layers or blocks, and (3) Selectively altering the resistivities of these layers or blocks to provide interconnections between the electronic components to form the desired network configuration.

All of these operations may be carried out in a single chamber housing a concentrated energy source, as an electron beam or laser, the energy source being selectively focused upon the semiconductor substrate or the layers or blocks thereon or therein to accomplish the desired operation. The operations may be performed without the requirement of a masking oxide, or the like due to the utilization of the "maskless writing" approach. This "in situ circuit writing" may then, if desired, be computer controlled.

For example, the energy source may be focused upon select portions of the substrate surface or within holes or cavities within the substrate to selectively "prepare" these selected portions for the vapor deposition or growth of single crystalline and/or polycrystalline layers of material. This "preparation" is accomplished in various manners, all of which are subsequently described, but the key factor is that any deposition or growth occurs selectively at these "prepared" portions without the necessity for oxide masking the substrate.

In addition, the concentrated energy source may be utilized to selectively heat portions of the substrate (or layers therein) in the presence of impurities to cause the selective diffusion of these impurities into the substrate or the layers.

Also, the energy source may be employed to selectively alter the resistivity of the substrate to provide interconnections between the various components, as well as to alter the magnetic properties of structure of the substrate.

All of these processes are performed without the necessity of masking to provide an integrated circuit structure having electronic components of extremely small dimensions.

The novel features believed characteristic of the invention are set forth with particularity in the appended claims. The invention itself, however, as well as further objects and advantages thereof may best be understood by reference to the following detailed description read in conjunction with the appended claims and drawings, wherein:

FIGURE 1 depicts one form of apparatus which may be utilized in practicing the present invention;

FIGURE 1A diagrammatically illustrates impingement of reactants on a substrate which has been inclined.

Figures 1, 1A:
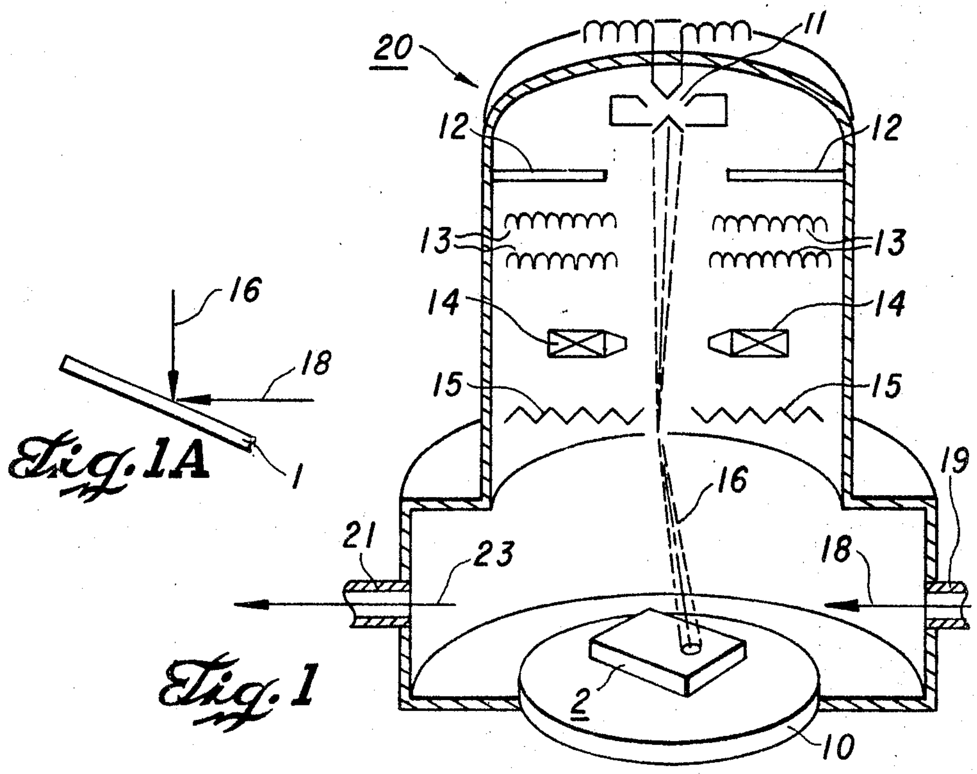

Referring now to FIGURE 1 there is illustrated one form of apparatus which may be utilized as the concentrated energy source to carry out the various processes of the present invention. Shown schematically are various components of an electron beam apparatus located within an evacuated chamber 20. The electron beam machine comprises a cathode filament 11 providing the source of electrons, and anode portion 12 for acceleration of the electrons, coils 13 and lens assembly 14 for focusing the accelerated electrons into a beam of desired size, and deflection coils 15 which direct the focused beam 16. An insulating block 10 provides support for the structure 2 to be operated upon. The reference numeral 2 will be used to designate the composite structure at any one period of time. Various conventional electron beam machines presently on the market may be utilized in the practice of the invention as well as other type energy sources, such as lasers.

Figure 2:
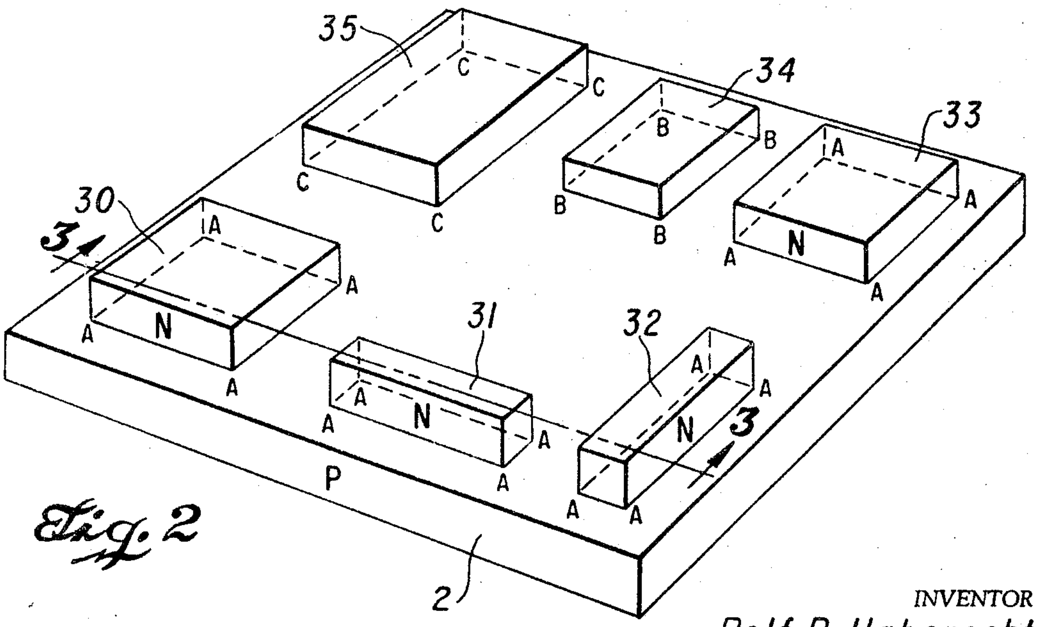
FIGURE 2 is a pictorial view of a semiconductor substrate showing layers or "blocks" of material selectively formed thereon.

The fabrication of an integrated circuit or microcircuit according to one process of the invention is described initially with reference to FIGURE 2, where "building blocks" of material are shown formed upon a surface of a semiconductor substrate 2. The electron beam is utilized to selectively "prepare" the surface of the substrate for the subsequent growth or deposition of the blocks or layers 30–35 of desired material. More specifically, this "preparation" is achieved by either selectively heating the substrate surface with the electron beam to a precise temperature in the presence of a reactant or reactants in the atmosphere, thereby causing the selective growth or vapor deposition, as the case may be, upon the substrate surface; or alternatively, altering the crystallographic structure of the surface of the substrate 2 to provide a compatible surface for the selective deposition of the desired materials.

In accordance with this objective, the semiconductor substrate 2 is placed within the evacuated chamber 20 upon the insulating support 10. A stream 18 of a vapor reactant or reactants is directed into the evacuated chamber 20 through an aperture 19 therein to flow over the top surface of the substrate. Using the deflection coils 15, the electron beam 16 is traced over the surface of the substrate so that selective portions thereof are heated in the presence of the stream 18 of reactants so that appropriate layers or zones of material are formed upon the surface of the substrate solely at the locus of the heating.

As an example, a technique known in the art for epitaxially growing single crystalline layers of silicon semiconductor material upon a silicon body involves the hydrogen reduction of silicon tetrachloride at approximately 1200° C. Accordingly, the starting material of the substrate 2 could be a P-type silicon, this substrate being placed upon the insulating support 10 within the chamber 20, the stream 18 composed of hydrogen and N-type doped silicon tetrachlorde, in vapor form, passing into the chamber 20 through the aperture 19. The N-type doped silicon tetrachloride vapor may be provided by bubbling hydrogen gas through a container of liquid silicon tetrachloride ($SiCl_4$) doped with phosphorus trichloride. Then, by selectively focusing the electron beam 16 upon the portions of the P-type substrate surface defined in FIGURE 2 by the letters A–A–A–A and selectively heating these areas to approximately 1200° C., the remainder of the surface of the substrate 2 remaining relatively cool, N-type silicon single crystalline semiconductor layers 30, 31, 32, and 33 are selectively epitaxially grown upon the P-type substrate 2, as observed in FIGURE 2. Since the remainder of the substrate 2 (not enclosed by A–A–A–A) remains below the deposition temperature of 1200° C. (there being relatively sharp temperature gradients at these points) there will be little or no epitaxial deposition except on the heated portions. This selective growth may be additionally assured by the careful control of the flow rate of the stream 18, and by the quick removal of reaction by-products through the exit aperture 21.

In similar manner, polycrystalline films 34 of dielectric material and films 35 of ferrite material may be selectively formed upon the P-type silicon substrate 2 by selectively heating the areas B–B–B–B and C–C–C–C, respectively, to the required deposition temperatures in the presence of appropriate vapor reactants. The dielectric layer 34 may be of any conventional dielectric compound, for example, titanium dioxide, cesium dioxide, silicon dioxide, etc. and the ferrite layer 35 may be yytrium iron garnet ($Y_3Fe_5O_{12}$) or of other classes of ferrites.

Various types of vapor reactants may be utilized in conjunction with the energy source (electron beam) to form the dielectric or ferrite films. For example, when the substrate 2 is of silicon, the stream 18 may be composed of stream or dry oxygen ($O_2$), the silicon material reacting directly with the oxygen at the selectively heated locations to form thermally grown silicon oxide (dioxide). When the substrate 2 is other than silicon semiconductor material, and the layer 34, for example, is to be of silicon dioxide, the electron beam selectively heats the desired substrate area from 250° to 500° C., and then by flowing oxygen and tetraethoxysilane in vapor form over the selectively heated portions B–B–B–B of the substrate 2 the silicon dioxide layer 34 is formed. On the other hand when the layer 34, for example, is to be of titanium oxide, the electron beam heats the area B–B–B–B to a temperature in excess of 200° C., and then by flowing a mixture of water vapor and titanium tetrachloride over the selectively heated area, the selective deposition of titanium dioxide occurs. In like manner, the ferrite film 35 may be preferentially formed by evaporation or vapor deposition in conjunction with the selective heating of the substrate.

In accordance with another feature of the present invention, the energy source is utilized to alter the crystallographic structure at the surface of the substrate. This alteration may take the form of slightly changing the stoichiometry of the semiconductor substrate surface by either introducing impurities into the lattice spacing or dislocating atoms to vary this lattice spacing to promote crystal growth or by greatly altering the crystallographic structure of the surface of the substrate to prevent growth of any type.

The slight alteration of the crystallographic structure of the semiconductor substrate surface to vary the lattice spacing is of particular use when one kind of semiconductor material is to be epitaxially grown upon another kind of semiconductor material, particularly semiconductor materials which, because of their ordinary differences in lattice spacing are not compatible for epitaxial growth. Thus the semiconductor layers 30–33 may be of single crystalline germanium or silicon, for example, selectively epitaxially grown upon a substrate 2 of semi-insulating gallium arsenide. The semi-insulating gallium arsenide then provides electrical isolation of the silicon or germanium regions 30–33.

When the substrate 2 is of a compound semiconductor material as the III–V or II–VI compounds, the semiconductor regions 30–33 may be selectively grown, as illustrated in FIGURE 2, by focusing the beam 16 on the selected portions of the substrate surface, to decompose the semiconductor surface at these selected portions so that epitaxial growth occurs solely upon the undecomposed portions. In particular, when the semiconductor substrate 2 is of gallium arsenide (GaAs), and the electron beam selectively heats the surface of the substrate 2 outside the areas defined by the letters A–A–A–A, the arsenic atoms are driven off by evaporation, leaving a gallium-rich surface except at the areas defined by the letters A–A–A–A, and when the substrate is subsequently subjected to a conventional vapor phase epitaxial deposition process, gallium arsenide layers deposit preferentially upon the areas A–A–A–A rather than upon the gallium-rich surface areas, thereby selectively providing the semiconductor regions or layers 30–33.

Various modifications may be included with the above described processes for selectively producing the various layers 30–35. For example, as illustrated in FIGURE 1A, it may be desirable to tilt the substrate 2 at a specified angle so that the stream of reactant vapors 18 intersect the surface of the substrate 2 solely at the locus of the intersection of the electron beam 16 to prevent any possibility of the electron beam 16 decomposing the reactants in the stream 18 before the selective formation of the layers 30–35. In addition, various impurities of varying concentration levels may be introduced into the stream 18 to provide layers 30–33 of varying conductivity and/or concentration.

Although the blocks or layers 30–35 are illustrated in FIGURE 2 as having been selectively formed upon a surface of the substrate 2, this is not to be construed in a restrictive manner as the blocks 30–35 may also be selectively formed within holes or pockets within the substrate 2.

Figures 3, 4:
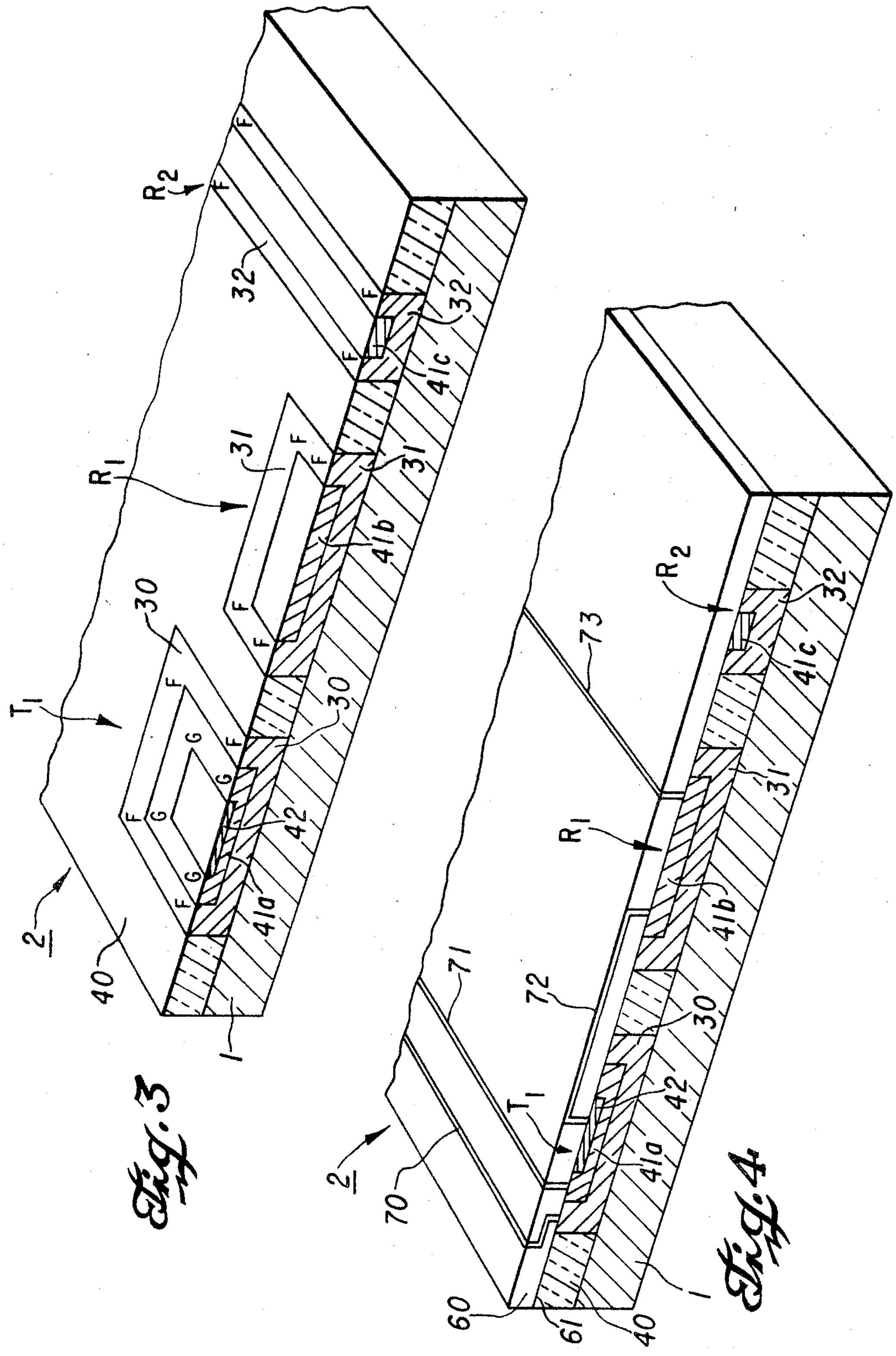
FIGURES 3 and 4 are pictorial views in section of a portion of the substrate shown in FIGURE 2 taken along the section line 3—3.

The various "blocks" or layers 30–35 represent regions into which various components of an integrated circuit may now be formed. Before such fabrication, however, it is desirable to grow or deposit insulating material between each of the blocks to provide electrical isolation as well as to provide a flat planar surface. When the substrate 2 is of silicon, the stream 18 is of steam or dry oxygen ($O_2$) which is passed through the aperture 19 over the top surface of the structure comprising the substrate 2 and the layers 30–35. The electron beam 16 selectively heats up the portions of the surface intermediate the various blocks or layers 30–35 to a temperature of approximately 1200°–1500° C. in the presence of the stream 18, thereby to grow a layer 40 of thermally grown silicon oxide adjacent the blocks 30, 31, 32, for example, as shown in FIGURE 3, to isolate each of these blocks from one another and to provide a flat planar surface as observed in FIGURE 3. This step may be accomplished immediately after the formation of the blocks 30–35 and while the body 2 remains in the chamber 20.

As the next step in the fabrication of a micro-circuit according to the invention, while the body 2 remains in the chamber 20 and utilizing the electron beam as a selective heating means, preferential diffusions are effected within the selectively formed regions 30, 31, and 32, to form the various active and passive components of the integrated network. Accordingly, an appropriate impurity-containing vapor 18 flows over the body 2, the electron beam selectively heating the desired portions of the regions 30, 31, and 32 and the consequent reaction at the heated portions causes the impurity to diffuse into the select portions of these regions.

This diffusion process is applicable for various semiconductor materials, but is presently described for a substrate 2 of P-type silicon, the blocks or layers 30, 31, and 32 of N-type silicon, and an insulating layer 40 of silicon oxide or dioxide. The electron beam 16 is appropriately focused and deflected to heat the select surface portions of the layers 30–32 (designated in FIGURE 3 as F–F–F–F) to a temperature of approximately 800° C. or higher and the vapor stream 18 entering the opening 19 contains boron impurities. As particular examples, the vapor 18 can be of boron trichloride ($BCl_3$), boron tribromide ($BBr_3$), diborane ($B_2H_4$), or boron oxide ($B_2O_3$), all in gaseous phase. By controlling the time of incidence of the beam upon these surface portions, the boron impurities diffuse to the desired depth to form the P-type regions **41*a*, 41*b*, and 41*c* shown in FIGURE 3. In similar manner, the electron beam is next confined to the select surface portions defined by the area G–G–G–G, to heat only this select surface portion to approximately 800° C., in the presence of the vapor 18 being of a donor impurity such as phosphorous trichloride ($PCl_3$) or phosphorous pentoxide ($P_2O_5$) gas, thereby resulting in the selective diffusion of a P-type region 42. Reaction by-products 23 then exit by way of exhaust 21**.

The beam voltage and current are adjusted during this selective diffusion heating operation so that only surface heating occurs and not surface damage. It has been observed that no surface damage occurred when the beam voltage was kept below 30 kev. and the current below 1000 μamps. The area of heating may be determined by beam size and shape, and the extent of the diffusion by the beam energy and the length of heating time.

The P-type region 30 thus provides the collector region of the transistor $T_1$, N-type region 42 provides its emitter, and P-type regions **41*a*, 41*b*, and 41*c*** provide the base of the transistor $T_1$, the resistor $R_1$, and the resistor $R_2$, respectively.

Referring now to FIGURE 4, there is described the next step in the fabrication of an integrated circuit in accordance with the invention. A dielectric layer 60 is formed in any conventional manner upon the surface 61 over the components $T_1$, $R_1$, and $R_2$. This layer may be of various materials, for example cesium dioxide ($CeO_2$) or titanium dioxide ($TiO_2$).

In copending U.S. patent application, S.N. 398,480, filed Sept. 8, 1964, and assigned to the assignee of the present application, a process is described wherein an energy source, as an electron beam, is used to selectively alter portions of a dielectric body to form electrically conductive paths upon the dielectric body. In accordance with this described process, the electron beam, when traced along a predetermined path on portions of the surface of a dielectric body, "reduces" these portions from their high resistivity value to a substantially higher conductivity. The conductivity can then be lowered further by plating a metal to these to higher conductivity reduced portions.

Utilizing this process described in the above-referenced application, select portions of the dielectric layer 60 are selectively converted to form conducting paths 70, 71, 72 and 73, observed in FIGURE 4, making contact to the various regions of the components $T_1$, $R_1$, and $R_2$. The selective conversion of the dielectric material below the surface of the layer 60 may be performed by directing a plurality of electron beams at the point below the surface which is to be converted, each beam by itself not possessing sufficient energy to convert the select portion of the dielectric layer to the desired conductivity, but the combination of beams beneath the surface possessing sufficient energy, so that at their intersection, and solely at their intersection, beneath the surface, the select conversion occurs. Thus, the emitter region 42 of the transistor $T_1$, for example, is electrically connected to one end of the resistor $R_1$.

Figure 7:
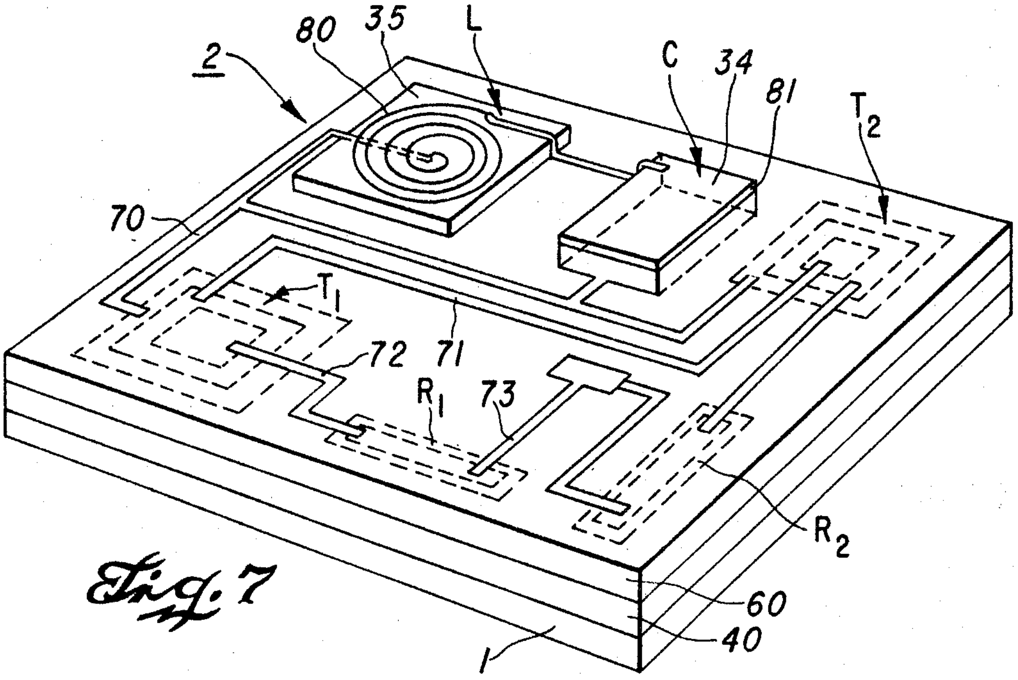
FIGURE 7 illustrates a completed integrated network fabricated in accordance with the invention.
Figure 8:
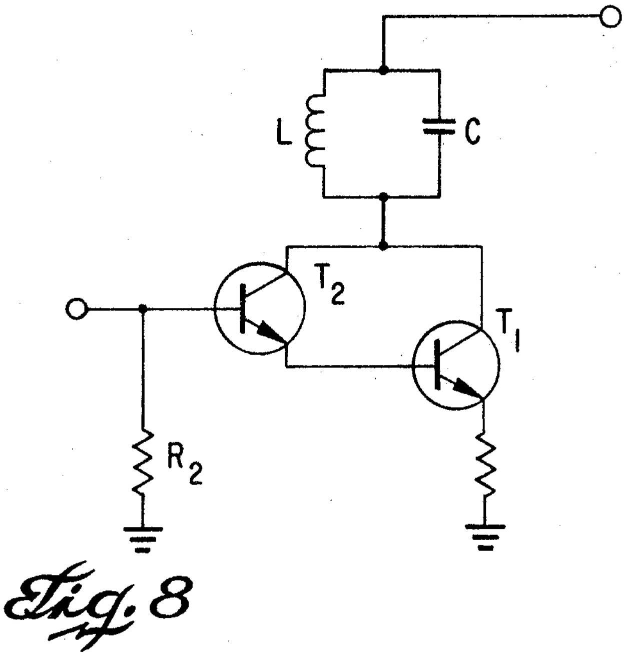
FIGURE 8 is a schematic diagram of the network of FIGURE 7.

In similar manner, while the structure 2 remains within the chamber 20, utilizing selective conversion or reduction of dielectric material to conductive portions or layers, as described in said copending application, an inductor L, FIGURE 7, and capacitor C may be fabricated within the blocks or layers 35 and 34, respectively. The inductor L, for example, is formed by selectively focusing the electron beam upon the surface of the ferrite block 35 to selectively "reduce" or convert the surface to a conductive spiral 80. The capacitor C may be formed by reducing or converting the entire top surface of the dielectric block 34 to form a conductive plate 81, the other plate of the capacitor being the semiconductor substrate 2, or alternatively a metallic region formed upon this substrate 2 before the selective deposition of the dielectric block 34. Selective conductive paths are then formed, as before, utilizing the electron beam, to interconnect the inductor L and the capacitor C with each other and with the other components $T_1$, $T_L$, $R_1$, and $R_2$ to provide the circuit shown schematically in FIGURE 8.

Figure 5:
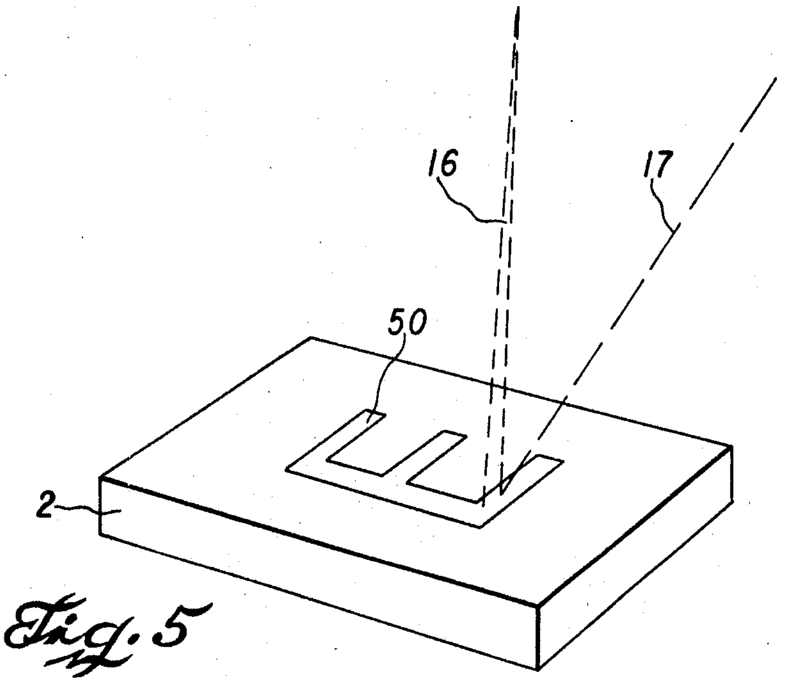
FIGURE 5 depicts one technique for a selective diffusion operation in accordance with the invention.

As another feature of the present invention, there is described with reference to FIGURE 5, an alternate technique for the selective diffusion operation. The electron beam 16 is utilized, as before, as a selective heating means, but instead of providing the impurity in vapor form, a separate ion beam 17 serves as the impurity source. For example, when the body 2 is of silicon, the beam 17 may be composed of boron ions. Thus, by simultaneously and coincidentally tracing the electron beam 16 (providing the heating) and the beam 17 (providing the impurities) upon the surface of the substrate, a P-type diffused region 50 may be formed to any desired configuration, as the E-shaped region shown. When the body 2 is of gallium arsenide, it may be desirable to use a different energy source as a laser, to provide the selective heating for the diffusion, in addition to carefully controlling the atmospheric conditions in the chamber to prevent the decomposition of the substrate.

Figure 6:
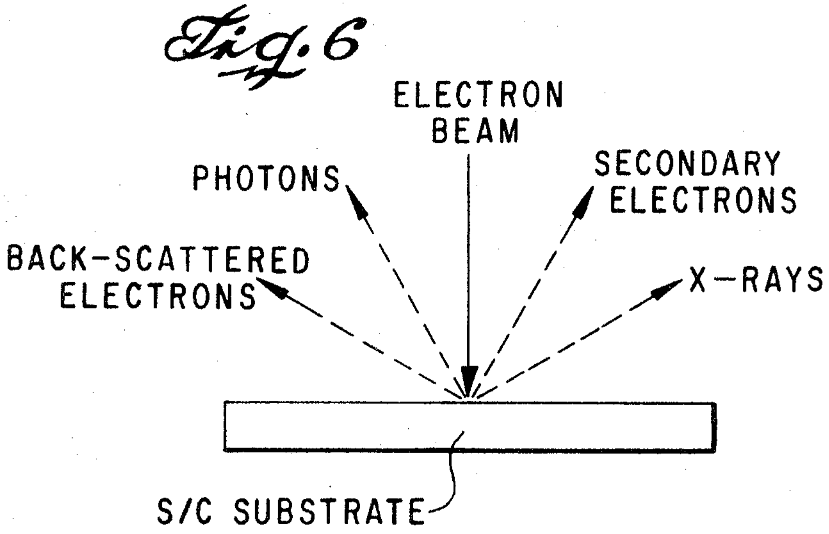
FIGURE 6 illustrates secondary emission from a semiconductor substrate.

As will now be described, the use of the electron beam as the heat source for the selective diffusions offers a means for more precisely controlling the diffusion concentrations and depths. It is known that when a beam of electrons impacts and penetrates a substrate surface, a secondary emission of electrons, photons, X-rays, as well as back-scattered electrons is produced. This phenomenon is illustrated with respect to a semiconductor substrate in FIGURE 6. It has been observed that this secondary emission is a function of electron beam parameters, substrate temperature, dopant concentrations, and diffusion depths and profiles in the semiconductor substrate. By monitoring and measuring the character and rate of this secondary emission and changes thereof for known beam voltages and currents, substrate temperatures, dopant concentrations, diffusion depths and profiles, it is then possible, on a high production basis, to determine and consequently automatically control the diffusion operations during micro-circuit fabrication so as to achieve very precise concentrations and depths of the various regions of a transistor, for example.

Various modifications may be made of the above-described processes. For example, although there is a substantial advantage achieved by performing all of the fabrication steps consecutively and within a single chamber, each of the described steps such as the selective formation of the layers of material, the selective heating and diffusion operation, and the selective altering of the resistive and magnetic properties of the blocks or layers, for example, may be carried out as separate steps or various combinations of steps. Furthermore any or all of these operations may be incorporated with the process described and claimed in copending U.S. patent application, S.N. 518,099, filed Jan. 3, 1966, and assigned to the assignee of the present application, wherein there is described the use of a beam of energy to form protuberances or hills of monocrystalline semiconductor material.

Various other modifications of the processes of this invention may be made by those skilled in the art without departing from the scope of the invention as defined by the appended claims.

What is claimed is:

1. In a method for fabricating an integrated network of semiconductive devices, the steps of:

(a) placing a substrate of a III–V compound semiconductor material within a chamber housing a concentrated energy source;

(b) focusing said concentrated energy source upon select portions of a surface of said substrate to decompose said select portions by evaporation of only the Group V element from said III–V compound; and (c) directing a flow of vapor reactants over said substrate to effect epitaxial deposition upon the undecomposed portions of said substrate.

2. The method as described in claim 1 wherein said substrate is of gallium arsenide semiconductor material and said decomposition is by evaporation of arsenic atoms from said select portions of said substrate resulting in said select portions being gallium-rich.

References Cited

UNITED STATES PATENTS

| | | | |
|---|---|---|---|
| 2,902,583 | 9/1959 | Steigerwald. | |
| 3,098,774 | 7/1963 | Mark | 148—175 X |
| 3,102,828 | 9/1963 | Courvoisier | 148—175 X |
| 3,242,014 | 3/1966 | Takagi | 148—1.5 |
| 3,298,880 | 1/1967 | Takagi | 148—191 |
| 3,341,754 | 9/1967 | Kellett et al. | 148—1.5 X |
| 3,351,503 | 11/1967 | Fotland | 148—188 |

FOREIGN PATENTS

| | | |
|---|---|---|
| 695,178 | 8/1953 | Great Britain. |

L. DEWAYNE RUTLEDGE, Primary Examiner

R. A. LESTER, Assistant Examiner

U.S. Cl. X.R.

117—106, 201, 212, 213; 148—191